United States Patent [19]

Shimizu et al.

[11] Patent Number: 4,896,294
[45] Date of Patent: Jan. 23, 1990

[54] SEMICONDUCTOR MEMORY DEVICE WITH ROW AND COLUMN WORD LINES AND ROW AND COLUMN BIT LINES

[75] Inventors: Mitsuru Shimizu, Sakura; Nobuyuki Ikumi, Tokyo, both of Japan

[73] Assignee: Kabushiki Kaisha Toshiba, Kawasaki, Japan

[21] Appl. No.: 261,866

[22] Filed: Oct. 25, 1988

[30] Foreign Application Priority Data

Dec. 9, 1987 [JP] Japan .................................. 62-311177

[51] Int. Cl.$^4$ ........................ G11C 7/00; G11C 11/40; G11C 8/00
[52] U.S. Cl. ................................ 365/149; 365/230.03; 365/230.06; 365/230.09; 365/221; 365/63; 365/189.01
[58] Field of Search ...................... 365/149, 63, 189.01, 365/230.03, 230.06, 230.09, 221

[56] References Cited

U.S. PATENT DOCUMENTS 4,758,988 7/1988 Kuo .................................. 365/200 X
4,768,171 8/1988 Tada ............................ 365/189.08 X Primary Examiner—Stuart N. Hecker
Assistant Examiner—Alyssa H. Bowler
Attorney, Agent, or Firm—Finnegan, Henderson, Farabow, Garrett and Dunner

[57] ABSTRACT

A memory cell contains a first MOS transistor, a second MOS transistor, and a capacitor, which are connected at the first ends to one another. A word line for a first cell series, is connected to the gates of first MOS transistors in the memory cells arrayed in a row. A word line for a second cell series, is connected to the gates of second MOS transistors arrayed in a column. A bit line for the first cell series, is connected to the second ends of the first MOS transistors in the row. A bit line for the second cell series, is connected to the second ends of the second MOS transistors in the column. A selection circuit selects the first cell series or the second cell series, according to an external input signal for cell series selection. According to the semiconductor memory deivce, one of the first and second cell array series of the memory cell array can be accessed according to a logic level of the array series select signal.

5 Claims, 5 Drawing Sheets

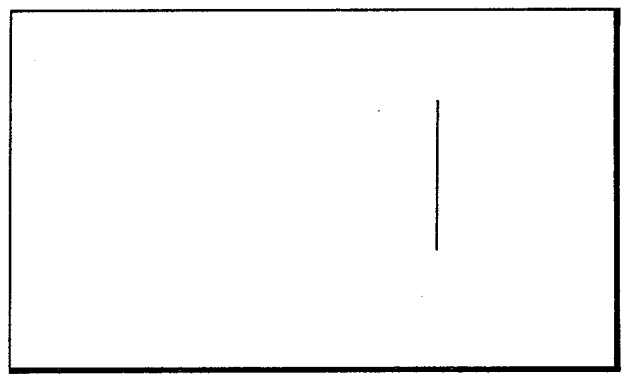
F I G. 2

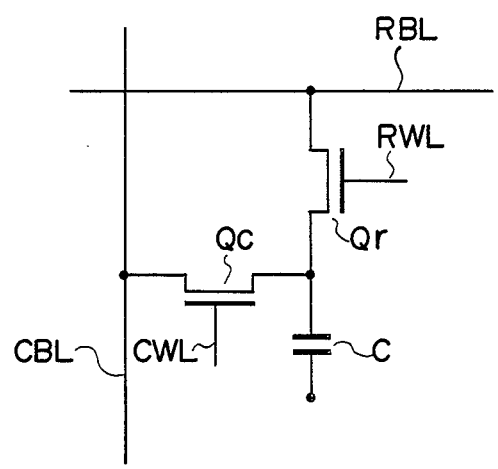
F I G. 4
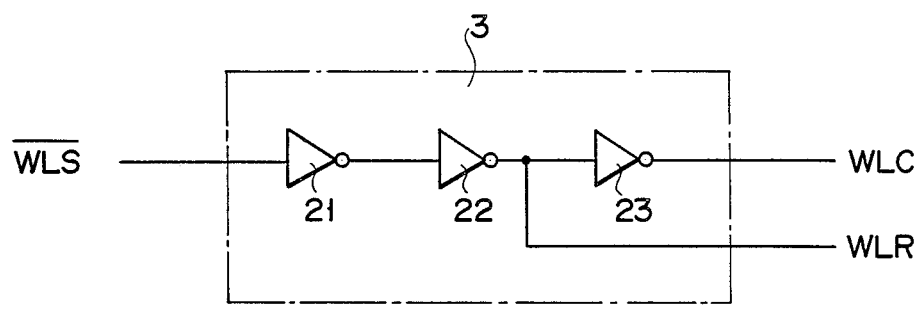
F I G. 5

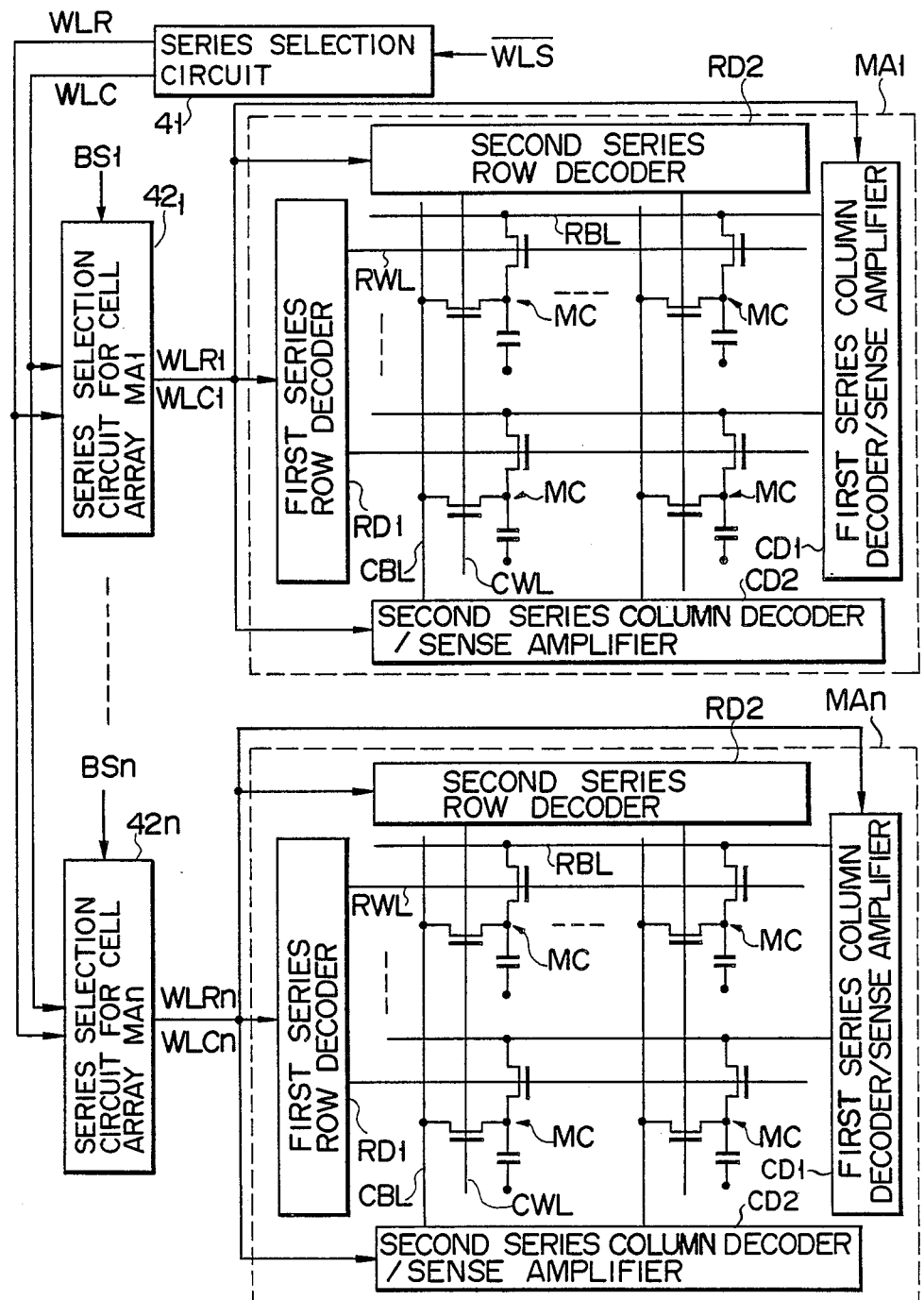
F I G. 6

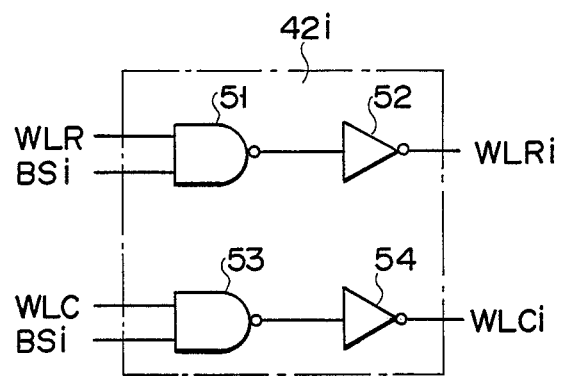
F I G. 7
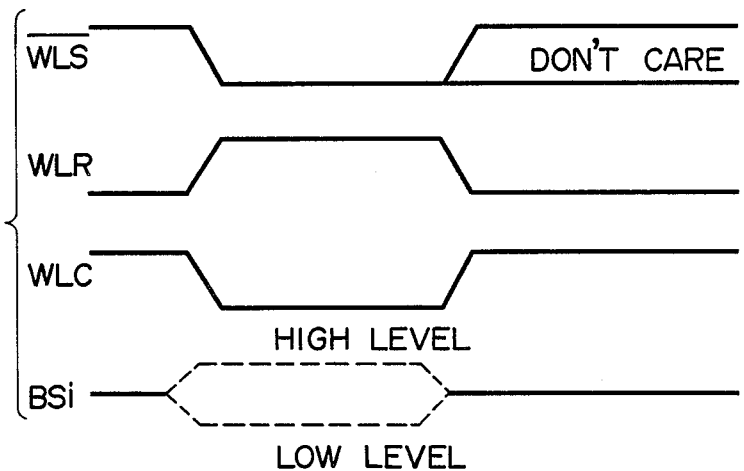
F I G. 8

SEMICONDUCTOR MEMORY DEVICE WITH ROW AND COLUMN WORD LINES AND ROW AND COLUMN BIT LINES

BACKGROUND OF THE INVENTION

1. Field of the Invention

This invention relates to a semiconductor memory device used for image processing, for example, and more particularly to a memory device of the type in which high speed access to a memory array is possible in the row and column directions.

2. Description of the Related Art

With the increase in memory capacity of semiconductor memory devices, their range of application has expanded into the field of image processing. Particularly in the dynamic image memory applied for the image processings, various types of high speed operation modes have been used in order to obtain a high speed access to the memory cell array. These modes are, for example, nibble mode, high speed page mode, and static column mode. An exemplar prior image memory will be described with reference to FIG. 1. Memory cell MC is made of MOS transistor Q and capacitor C, as shown in FIG. 1. Memory cells thus arranged are arrayed in a matrix fashion to form a cell array. The memory cells MC arrayed on a row in the memory matrix are connected to a single word line WL. Memory cells MC on a column are connected to a single bit line BL.

In a high speed mode used in the image memory of prior art, the memory cells of the memory cell array are accessed at a high speed in the row direction. Specifically, in this mode, one word line is first selected, and the data of the memory cells MC coupled with the selected word line are sequentially accessed.

When using the high speed access mode, it is impossible to access at a high speed the memory cells coupled with different word lines, since the different word lines must be selected line by line. Therefore, a long time is needed until all of the memory cells of the different word lines have been accessed.

In the image processing system using the image memory, there frequently occurs a situation that the image data must be scanned at a high speed in the vertical direction on the display screen, as shown in FIG. 2. This situation occurs particularly when a graphic display is performed. Normally, the pixel data in the row and column directions on the display are stored in the image memory in a corresponding layout. At the present stage of this technology where the high speed access to the image memory in the column direction is impossible, it is impossible to vertically display an image on the display at high speed.

SUMMARY OF THE INVENTION

With the view of solving the above problem, this invention has an object to provide a semiconductor memory device suitable for a high speed display in both the horizontal and vertical directions on the display.

Another object of this invention is to provide a semiconductor memory device of the multibit structure in which a plurality of memory blocks are accessible in any one of the two different directions, and an access direction to one memory cell array block may be selected to be different from that of another memory cell array block.

According to an aspect of this invention, there is provided a semiconductor memory device comprising:
a memory cell array including a plurality of memory cells arrayed in a matrix fashion, each of said memory cells including a first MOS transistor, a second MOS transistor, and a capacitor, which are connected at the first ends to one another;
a word line for a first cell series, connected to the gates of first MOS transistors in the memory cells arrayed a row;
a word line for a second cell series, connected to the gates of second MOS transistors arrayed in a column;
a bit line for the first cell series, connected to the second ends of the first MOS transistors in said row;
a bit line for the second cell series, connected to the second ends of the second MOS transistors in said column; and
a cell series selection circuit for selecting one of the first cell series and the second cell series, according to the external input signal for cell series selection.

According to another aspect of the present invention, there is provided semiconductor memory device of multibit structure having a plurality of memory cell arrays for storing the data of the respective bits constituting a word, said semiconductor memory device comprising:
memory cell arrays including a plurality of memory cells arrayed in a matrix fashion, each of said memory cells including a first MOS transistor, a second MOS transistor, and a capacitor, which are connected at the first ends to one another;
a word line for a first cell series, connected to the gates of first MOS transistors in the memory cells arrayed in a row in a memory cell array;
a word line for a second cell series, connected to the gates of second MOS transistors in a column in the memory cell array;
a bit line for the first cell series, connected to the second ends of the first MOS transistors in said row in the memory cell array;
a bit line for the second cell series, connected to the second ends of the second MOS transistors in said column in the memory cell array; and
a cell series selection circuit for selecting a desired one of said first and second cell series of a desired one of said memory cell arrays, according to a first external input signal for selecting one of said first cell series and said second cell series, and a second external input signal for selecting one of said memory cell arrays.

With such an arrangement, each of a plurality of memory cell arrays can be accessed in a predetermined one of two different access directions. Additionally, the access direction to a memory cell array can be selected to be different from that to another cell array.

BRIEF DESCRIPTION OF THE DRAWINGS

FIG. 2 shows a view of a display in which an image is vertically displayed on the display screen;

FIG. 4 shows a circuit diagram of a memory cell in the memory device shown in FIG. 3;

FIG. 5 shows a circuit diagram of a series selection circuit in the memory device of FIG. 3;

FIG. 6 shows a circuit diagram of a semiconductor memory device of a n-bit structure according to another embodiment of this invention;

FIG. 7 shows a circuit diagram of a cell series selection circuit for a memory cell array of the memory device shown in FIG. 6;

FIG. 8 shows signal charts in the operation of the cell series selection circuit of FIG. 7.

DETAILED DESCRIPTION OF THE PREFERRED EMBODIMENTS

An embodiment of a semiconductor memory device according to this invention will be described with reference to the accompanying drawings.

Figure 3:
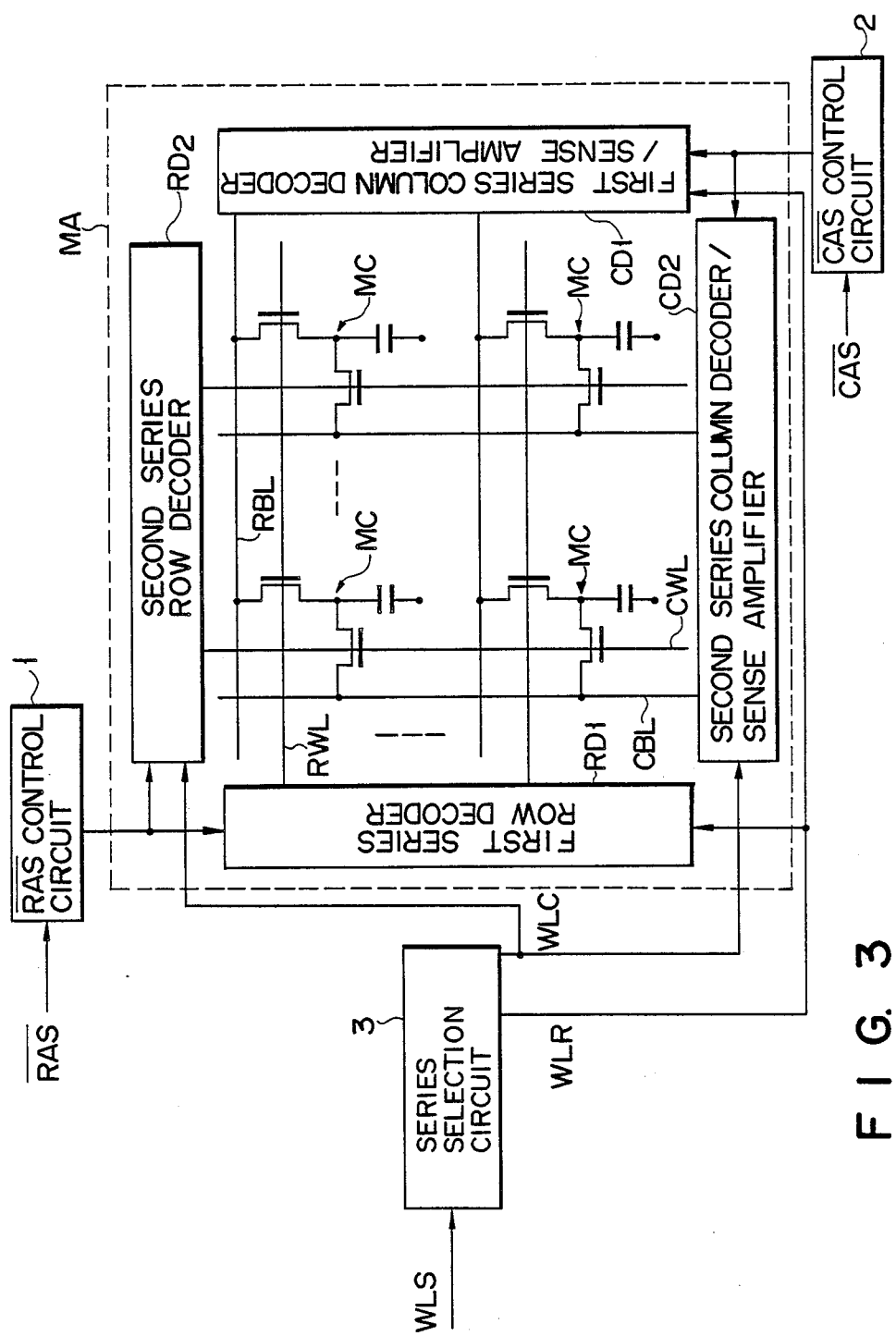
FIG. 3 shows a semiconductor memory device of a one-bit structure according to an embodiment of this invention.

FIG. 3 shows a part of a dynamic random access memory (DRAM). In the figure, MA indicates a memory cell array, and reference numeral 1 a $\overline{RAS}$ (row address strobe) control circuit for outputting a control signal in response to a $\overline{RAS}$ signal. Numeral 2 designates a $\overline{CAS}$ (column address strobe) control circuit for outputting a control signal in response to a $\overline{CAS}$ signal. Reference numeral 3 designates a cell series selection circuit for selecting one of two different cell series of memory cell array MA. This selection circuit receives select signal $\overline{WLS}$ to selectively activate control output line WLR or WLC.

In the memory cell array MA, memory cells MC are arrayed in a matrix fashion. Word lines RLW and bit lines RBL of the first cell series of cell array MA are laid out in the horizontal or row direction of the memory cell array. Word lines CWL and bit lines CBL of a second cell series are laid out in the vertical or column direction of the memory array. As shown in FIG. 4, each memory cell MC is structured in such a way that MOS transistors QR and Qc for first and second transfer gates and capacitor C for charge storage are connected at first ends to one another. The second end of capacitor C is set at a predetermined potential. The potential may be power source voltage VDD, ½ VDD potential, or ground potential VSS. The gate and the second end of first MOS transistor QR are connected to the word line RWL and the bit line RBL of the first cell series. The gate and the second end of second MOS transistor QC are connected to the word line CWL and the bit line CBL of the second cell series of cell array MA. In this case, one word line RWL is connected to the gates of first MOS transistors QR in a row. One bit line RBL is connected to the second ends of these transistors. One word line CWL is connected to the gates of second MOS transistors Qc in a column. One bit line CBL is connected to the second ends of these transistors. Row decoder RD1 for the first cell series selects the word line RWL of the first cell series. Column decoder sense amplifier CD1 for the first cell series selects the bit line RBL of the first cell series, and amplifies the bit line potential. Row decoder RD2 for the second cell series selects the word line CWL of the second cell series. Column decoder sense amplifier CD2 for the second cell series selects the bit line CBL of the second cell series, and amplifies the bit line potential. These are controlled by circuits 1, 2 and 3. Row decoder RD1 for the first cell series is activated by the output signal of $\overline{RAS}$ control circuit 1 and the WLR output (activated when the $\overline{WLS}$ input signal is logically low) of all series selection circuit 3. The column decoder sense amplifier CD1 is activated by the output signal of $\overline{CAS}$ control circuit 2 and the WLR output signal of cell series selection circuit 3. The row decoder RD2 for the second cell series is activated by the output signal of $\overline{RAS}$ control circuit 1, and the WLC output (activated when the $\overline{WLS}$ input signal is logically high) of cell series selection circuit 3. Column decoder sense amplifier CD2 for the second cell series is activated by the output signal of $\overline{CAS}$ control circuit 2 and the WLC output of the series selection circuit 3.

The semiconductor memory is so designed that any of high speed access modes such as nibble mode, high speed page mode, and static column mode can be selected in either of the first and second cell serieses.

According to the semiconductor memory device, one of the first and second cell serieses of the memory cell array can be accessed according to a logic level of the cell series selection signal $\overline{WLS}$. The horizontal and vertical picture element data of the image of the picture display device of the horizontal/vertical scanning type are correspondingly stored into the memory in the row and column directions of the memory cell array. A high speed display in the horizontal direction on the display can be made by selecting the first cell series and making a row directional access to the memory cell array. Further, a high speed display of the vertical direction can be made by selecting the second cell series and making a column directional access to the memory cell array, as shown in FIG. 2.

FIG. 5 shows a circuit diagram of a series selection circuit used in the memory device of FIG. 3. The series selection circuit comprises three inverters 21 to 23 connected in series. Signal $\overline{WLS}$ is input to first inverter 21. Third inverter 23 outputs signal WLC. Output signal of second inverter 22 is used as signal WLR.

While in the above-mentioned embodiment, this invention has been applied to the memory device of one-bit structure, it is evident that this invention is applicable to a memory device of the multibit structure. A memory device of the n-bit structure will be described with reference to FIG. 6. The memory device comprises n memory cell arrays MA1 to MAn. These arrays store the data of the respective bits forming a word. Memory cell arrays MA1 to MAn are each constructed like the memory cell array MA shown in FIG. 3. Cell series selection circuit 41 and cell series selection circuits $42_1$ to $42_n$ function together to select a desired cell series in a desired memory cell according to an external signal input $\overline{WLS}$ for selecting one of two different cell serieses, and external input signals BS1 to BSn for selecting memory cell arrays MA1 to MAn. Cell series selection circuit 41 corresponds to cell series selection circuit 3 of the memory device of FIG. 3. Cell series selection circuits $42_1$ to $42_n$ are provided for memory cell arrays MA1 to MAn. Cell series selection circuit 41 receives external signal input $\overline{WLS}$, and renders active the internal signal WLR for the first cell series or the internal signal WLC for the second cell series according to the level of this input signal. Cell series selection circuits $42_1$ to $42_n$ render active first cell series select signals WLR1 to WLRn or second cell series selection signals WLC1 to WLCn of each memory cell array according to the output signals WLR and WLC of cell series selection circuit 41 and cell array selection signals BS1 to BSn. BSi to BSn may be I/D.

Figure 1:
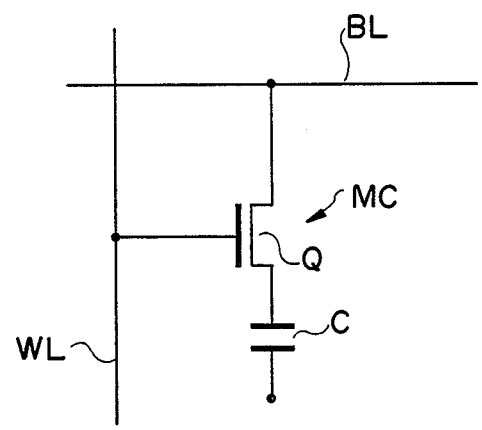
FIG. 1 shows a circuit diagram of a memory cell of a conventional semiconductor memory device.

As shown in FIG. 1, cell series selection circuit 42i (i=1 to n) comprises NAND gate 51 to which signals WLR and BSi (i=1 to n) are input. An output signal of NAND gate 51 is passed through inverter 52, so that it acts as output signal WLRi (i=1 to n). WLC input signal and BSi input signal are input to NAND gate 53. The output signal of this NAND gate 53 is passed through inverter 54, and acts as output signal WLCi. Therefore, as shown in FIG. 8, when the signal BSi corresponding to memory cell array MAi is logically high, the $\overline{WLS}$ input signal is active or logically low, and the signals WLR and WLC are logically high and low, respectively. At this time, signals WLRi and WLCi become logically high and low. In the memory cell array MAi coupled for reception with signals WLRi and WLCi, the first cell series is selected. On the other hand, when the signal BSi corresponding to memory cell array MAi is low in logic level, the signal $\overline{WLS}$ input signal becomes active, and signals WLRi and WLCi become high and low, respectively. In the memory cell array MAi coupled with signals WLRi and WLRi, the second cell series is selected. When signal $\overline{WLS}$ is in an inactive state or in a logic high level, signals WLR and WLC are logically low, so that signals WLRi and WLCi become logically low. Accordingly, the second cell series is selected in each of memory cell arrays MAi to MAn.

In the memory device of the n-bit structure, if input signals BS1 to BSn are set at desired logic level, when input signal $\overline{WLS}$ is active, it is possible to make an access to a desired cell series in each of memory cell arrays MA1 to MAn. In this case, it is possible to make an access to different cell serieses in the memory cell arrays (one is the first cell series and the other is the second cell series). If input signal $\overline{WLS}$ is inactive, it is allowed that a cell series can be fixed in a selected state in the memory cell arrays. Under this condition, it is possible to make an access to each memory cell array for the refreshing operation.

As described above, according to the semiconductor memory of the multibit structure, each memory cell array can be accessed in any one of the two different directions. Further, an access direction for one memory cell array may be selected to be different from that of another memory cell array.

According to a semiconductor memory device of this invention, the memory cell array can be selectively accessed in the two different directions. Therefore, the memory device according to this invention is suitable for the high speed display in both the horizontal and vertical directions on the image display.

What is claimed is:
1. A semiconductor memory device comprising:
    a memory cell array including a plurality of memory cells arrayed in a matrix fashion, each of said memory cells including a first MOS transistor, a second MOS transistor, and a capacitor, which are connected at the first ends to one another;
    a word line for a first cell series, connected to the gates of first MOS transistors in the memory cells arrayed a row;
    a word line for a second cell series, connected to the gates of second MOS transistors arrayed in a column;
    a bit line for the fist cell series, connected to the second ends of the first MOS transistors in said row;
    a bit line for the second cell series, connected to the second ends of the second MOS transistors in said column; and
    a cell series selection circuit for selecting one of the first cell series and the second cell series, according to the external input signal for cell series selection.

2. The semiconductor memory device according to claim 1, in which said first cell series word line and said first cell series bit line are arranged horizontally in the memory cell array, and said second cell series word line and the second cell series bit line are arrayed vertically in the memory cell array.

3. A semiconductor memory device of multibit structure having a plurality of memory cell arrays for storing the data of the respective bits constituting a word, said semiconductor memory device comprising:
    memory cell arrays including a plurality of memory cells arrayed in a matrix fashion, each of said memory cells including a first MOS transistor, a second MOS transistor, and a capacitor, which are connected at the first ends to one another;
    a word line for a first cell series, connected to the gates of first MOS transistors in the memory cells arrayed in a row in a memory cell array;
    a word line for a second cell series, connected to the gates of second MOS transistors in a column in the memory cell array;
    a bit line for the first cell series, connected to the second ends of the first MOS transistors in said row in the memory cell array;
    a bit line for the second cell series, connected to the second ends of the second MOS transistors in said column in the memory cell array; and
    a cell series selection circuit for selecting a desired one of said first and second cell serieses of a desired one of said memory cell arrays, according to a first external input signal for selecting one of said first cell series and said second cell series, and a second external input signal for selecting one of said memory cell arrays.

4. The semiconductor memory device according to claim 3, in which said cell series selection circuit includes a selection circuit for receiving said first external input signal for selecting one of said first cell series and said second cell series; and a plurality of selection circuits provided for said memory cell arrays, for receiving an output signal of the former-reacted selection circuit and said second external input signal for selecting one of said memory cell arrays, to generate an output signal for selecting said desired cell series of the desired memory cell arrays.

5. The semiconductor memory device according to claim 3, in which said selection circuit keeps said memory cell arrays in a state where one of said two cell series is selected, when said first external input signal for selecting one of said first and second cell series is inactive.

* * * * *

UNITED STATES PATENT AND TRADEMARK OFFICE
CERTIFICATE OF CORRECTION

PATENT NO. : 4,896,294
DATED : January 23, 1990
INVENTOR(S) : Mitsuru Shimizu et al.

It is certified that error appears in the above-identified patent and that said Letters Patent is hereby corrected as shown below:

<u>In The Claims</u>

Claim 3, Column 6, Line 37, change "serieses" to --series--.

Signed and Sealed this

Nineteenth Day of May, 1992

Attest:

DOUGLAS B. COMER

Attesting Officer     Acting Commissioner of Patents and Trademarks